United States Patent [19]

Rotolante

[11] 3,987,298

[45] Oct. 19, 1976

[54] PHOTODETECTOR SYSTEM FOR DETERMINATION OF THE WAVELENGTH OF INCIDENT RADIATION

[75] Inventor: Ralph A. Rotolante, Acton, Mass.

[73] Assignee: Honeywell Inc., Minneapolis, Minn.

[22] Filed: July 9, 1975

[21] Appl. No.: 594,472

[52] U.S. Cl. .......................................... 250/211 J
[51] Int. Cl.² ........................................ H01J 39/12
[58] Field of Search ............ 250/208, 211 J, 211 R, 250/212; 357/30, 29, 25

[56] References Cited
UNITED STATES PATENTS

| | | | |
|---|---|---|---|
| 3,454,769 | 7/1969 | Dynes | 250/212 |
| 3,508,126 | 4/1970 | Newman et al. | 250/211 J |
| 3,845,494 | 10/1974 | Ameurlaine et al. | 357/30 |

*Primary Examiner*—Eli Lieberman
*Assistant Examiner*—David K. Moore
*Attorney, Agent, or Firm*—David R. Fairbairn

[57] ABSTRACT

A photodetector system is used to resolve the wavelength of an unknown line source in a broad spectral range or to determine the temperature of blackbody or other broad band sources. The photodetector system includes two photodetectors having the same band gap but different thicknesses. The thicker of the two photodetectors receives radiation transmitted by the thinner photodetector. Because responsivity and quantum efficiency are influenced by detector thickness, a signal indicative of the wavelength or temperature is produced by taking the ratio of the signals from the two photodetectors.

16 Claims, 7 Drawing Figures

PHOTODETECTOR SYSTEM FOR DETERMINATION OF THE WAVELENGTH OF INCIDENT RADIATION

BACKGROUND OF THE INVENTION

The present invention relates to photodetectors. In particular, the present invention relates to a photodetector device for determining the wavelength of incident radiation from an unknown line (or "narrow band") source in a broad spectral range, or for distinguishing different blackbody or other broad band radiation sources.

Multicolor photodetector devices have been used in the past for spectral band analysis. For example, a radiometer which detects two wavelengths from the same braodband source and measures the ratio of the intensity of the two wavelengths can make temperature measurement independent of the emissivity of the source and the transmission of the intervening space. Examples of these devices are shown in U.S. Pat. No. 3,454,769 by Dynes, U.S. Pat. No. 3,478,214 by Dillman, and U.S. Pat. No. 3,638,026 by Scott et al and in H. Halpert and B. L. Musicant, "N-Color (Hg,CD)Te Photodetectors", *Applied Optics*, 11, 2157, (1972).

In general, these prior art devices utilize photodetectors of different band gaps. In most of the devices, narrow band filters are used to restrict the incident radiation to two narrow bands in the case of a two-color detector, or N narrow bands in the case of an N-color detector.

Although these devices can effectively distinguish different blackbody or other broad band radiation sources, they are unable to determine the wavelength of an unknown line source such as a laser.

SUMMARY OF THE INVENTION

The photodetector of the present invention is capable of determining the wavelength of an unknown source over a broad spectral range as well as being capable of distinguishing blackbody and other broad band radiation sources. The photodetector of the present invention comprises first and second photodetector means having essentially equal band gaps but different thicknesses. The thickness of the first photodetector means is such that not all radiation of energy equal to the band gap is absorbed. The second photodetector means is positioned to receive the radiation transmitted by the first photodetector means. The photosignals from the two photodetector means are processed by signal processing means to produce a signal indicative of the wavelength of the incident radiation or the temperature of the broadband source.

DETAILED DESCRIPTION OF THE PREFERRED EMBODIMENTS

Figure 1:
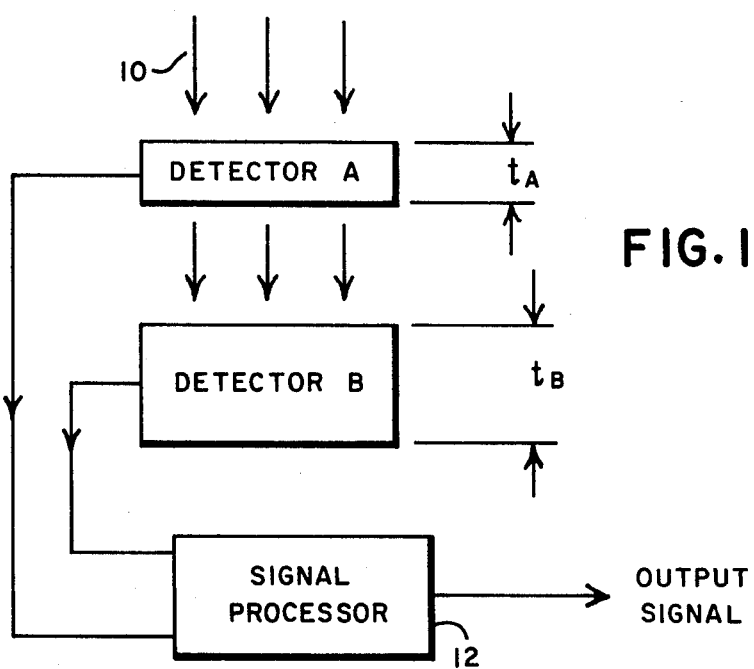
FIG. 1 shows one embodiment of the present invention.

FIG. 1 shows one embodiment of the photodetector system of the present invention. Photodetectors A and B are positioned to receive incident electromagnetic radiation 10. Detector A is placed in front of detector B, such that detector B receives the radiation transmitted by Detector A. This configuration eliminates the need for sequential time sharing and beam splitting, since the responses of the detectors are spatially as well as temporally equivalent. Problems of alignment, registry, and resolution are overcome because the sandwiched devices lend themselves readily to small element array fabrication.

Detectors A and B are formed of semiconductor materials having essentially the same band gap. The range of wavelengths over which the photodetector system will operate depends upon the particular semiconductor material selected. For example, mercury cadmium telluride ($Hg_{1-x}Cd_xTe$) detectors having $x = 0.2$ can be used for a photodetector system which covers the wavelength region from about 2 to 10 microns. If silicon photodetectors are used, the wavelength range is between about 0.3 microns and about 1.06 microns.

Detectors A and B may be photoconductive detectors or photodiodes. In either case, the thickness $t_A$ of detector A is less than the thickness $t_B$ of detector B. As will be discussed in detail below, this difference in thickness causes the photosignal produced by detector A to be different from the photosignal produced by detector B. The photosignals from the two detectors are received by signal processor 12, which produces a signal indicative of the wavelength of the incident radiation 10. In the preferred embodiments, signal processor 12 takes the ratio of the signals from detectors A and B. The output signal from the signal processor can be either an analog or digital signal.

The photodetector system is calibrated to operate for either line sources or broad band sources. If the wavelength of a line source is to be determined, the system produces a different discrete ratio for different wavelengths of incident radiation. If the temperature of a broad band source is to be determined, the system produces a different discrete ratio for different source temperatures.

Figure 2:
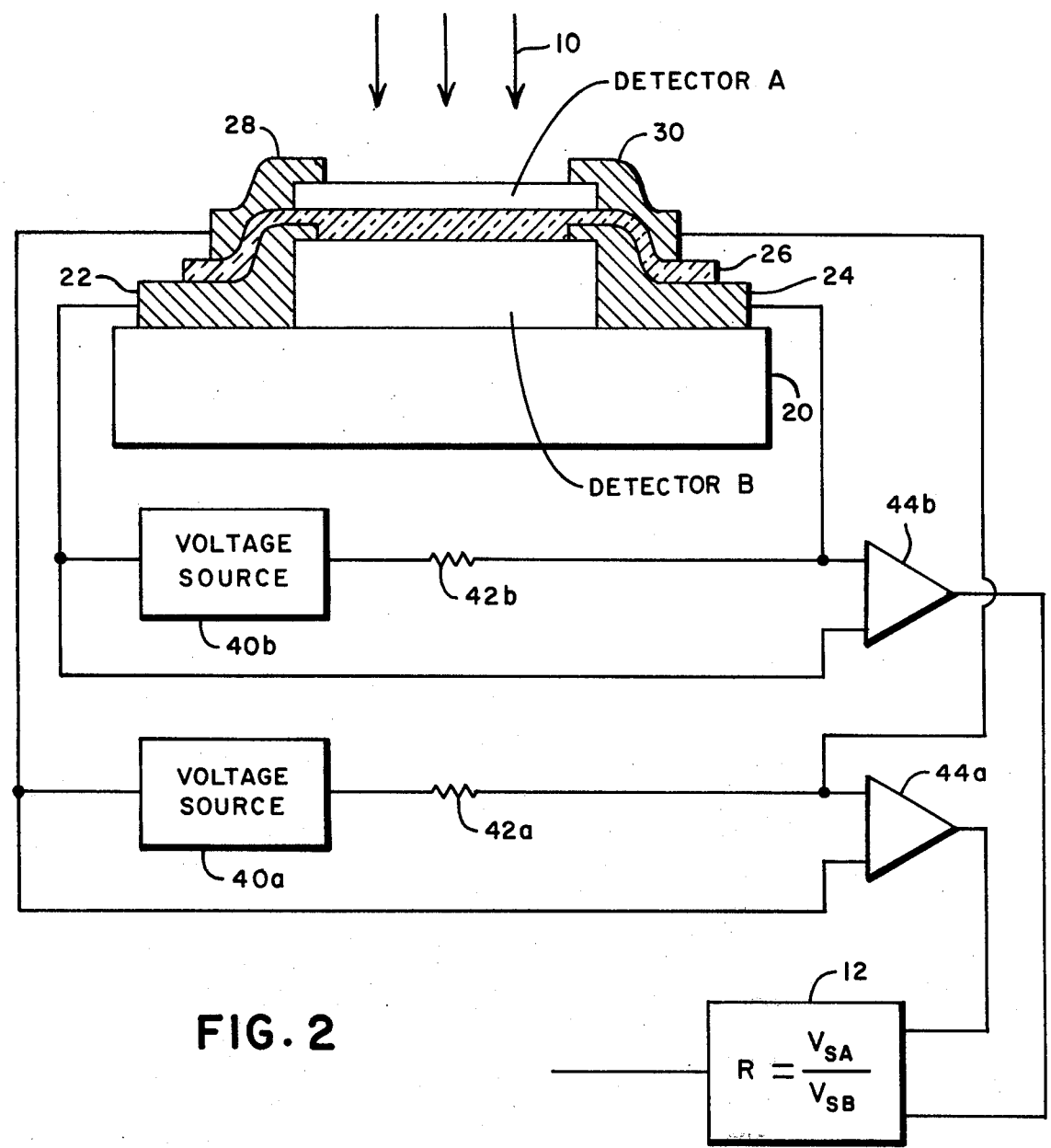
FIG. 2 shows a preferred embodiment of the photodetector system of the present invention.

FIG. 2 shows a preferred embodiment of the present invention in which detectors A and B are photoconductive detectors. Detector B is mounted on substrate 20. Electrodes 22 and 24 are attached to opposite ends of detector B. A transparent insulator 26 such as epoxy covers detector B and at least a part of electrodes 22 and 24. Detector A is mounted on insulator 26 above detector B. Electrodes 28 and 30 make electrical contact to opposite ends of detector A. As in FIG. 1, the thickness of detector A is less than the thickness of detector B.

Detector A is connected in series with voltage source 40a and load resistor 42a. Similarly, detector B is connected in series with voltage source 40b and load resistor 42b. Load resistors 42a and 42b have a resistance which is much greater than the resistance of detectors A and B, respectively. The detectors, therefore, operate in the "constant current mode". The change in resistivity of the detectors with incident radiation is sensed by measuring the voltage across detectors A and B. Amplifiers 44a and 44b amplify the voltage across detectors A and B, respectively.

The signals from amplifiers 44a and 44b are received by signal processor 12, which produces an output R which is equal to the ratio of the signals from the two detectors This ratio signal R is indicative of the wavelengths of the incident radiation.

The principle of operation of the present invention is based upon the variation of absorption coefficient with wavelength. Shorter wavelength (higher energy) radiation has a higher absorption coefficient than longer wavelength (lower energy) radiation. For that reason, a thick and a thin detector having the same band gap produce different signals in response to the incident radiation. The difference between the signals depends upon the incident wavelength.

Under steady state condition, the responsivity of a photoconductive detector is given by the equation $$R(\lambda) = \frac{\eta V_B}{l w t} \cdot \frac{\lambda}{hc} \cdot \frac{\tau}{n} \qquad \text{EQ. 1}$$

where
$V_B$ = the bias voltage
$l, w, t$ = the detector length, width and thickness
$\tau$ = the excess carrier lifetime
$n$ = the majority carrier concentration
$hc/\lambda$ = the energy of a photon with wavelength
and
$\eta$ = the fraction of the incident power absorbed by the detector and is defined as the quantum efficiency which can be expressed in terms of the material reflectivity $r$, the absorption coefficient $\alpha$, and the detector thickness $t$, i.e., $$\eta = \frac{(1-r)(1-e^{-\alpha t})}{(1-r e^{-\alpha t})} \qquad \text{EQ. 2}$$

Figure 3:
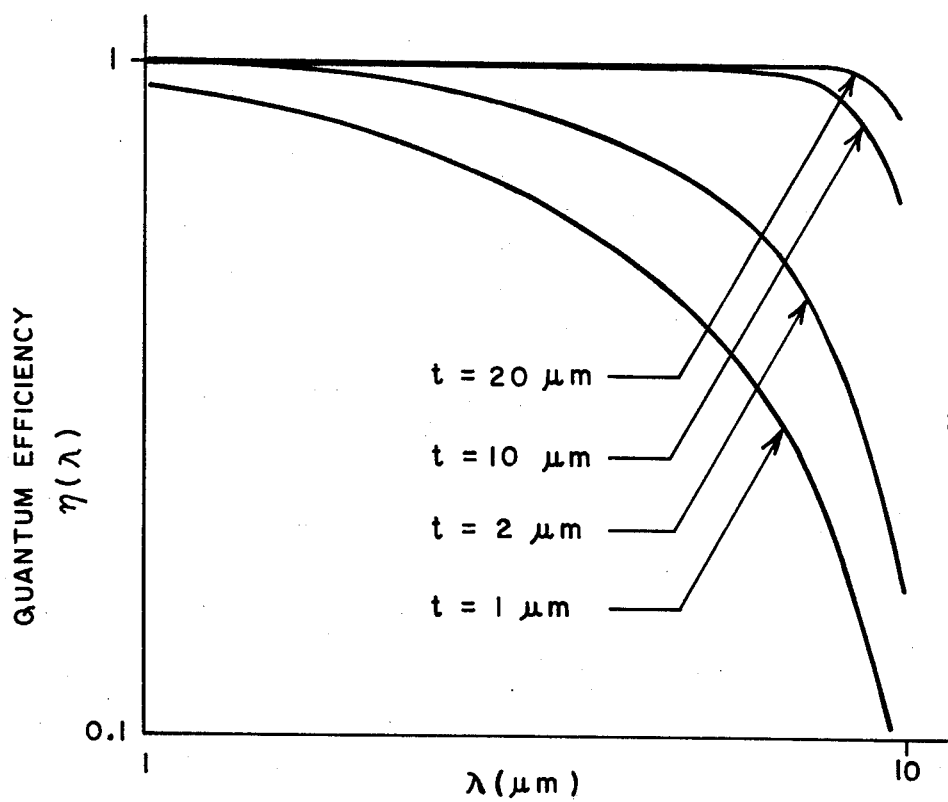
FIG. 3 shows the quantum efficiency as a function of wavelength for different thicknesses of mercury cadmium telluride photodetectors.
Figure 5:
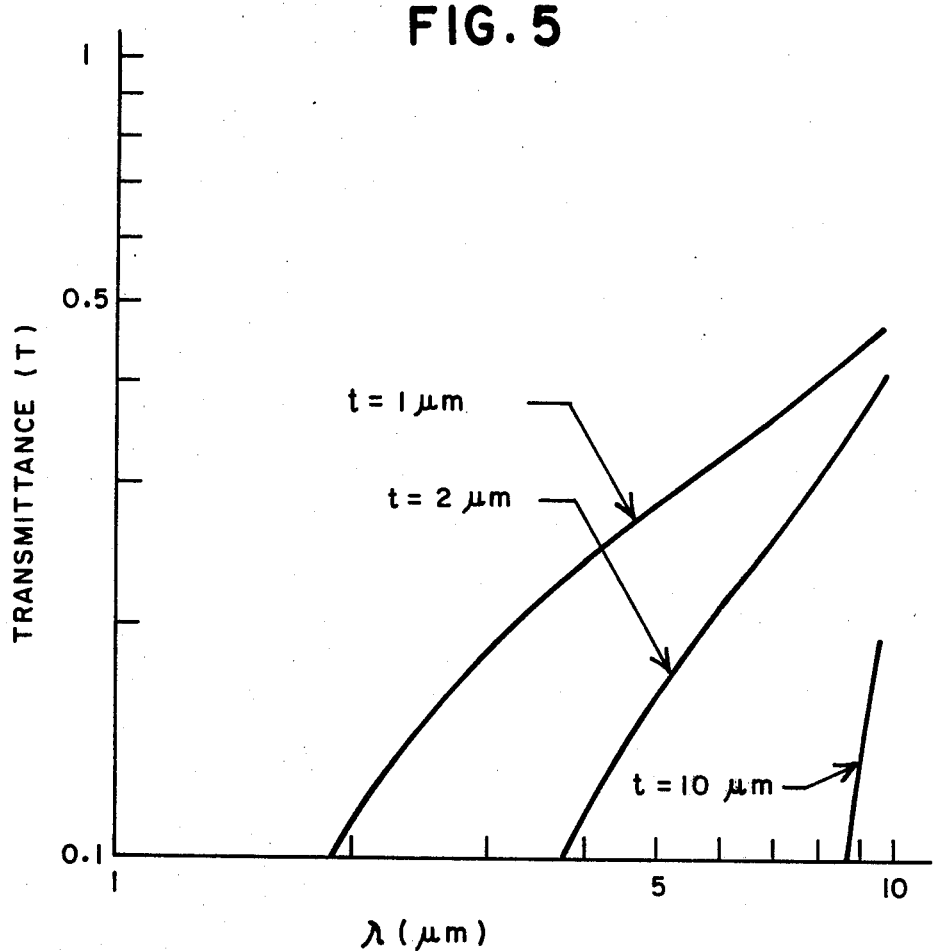
FIG. 5 shows transmittance as a function of wavelength for three mercury cadmium telluride photodetectors of different thicknesses.

Both responsivity and quantum efficiency are influenced by the detector thickness. FIG. 3 illustrates the effect of detector thickness on the quantum efficiency. Only when $t > 1/\alpha$ can the theoretical limit of $\eta = 1 - r$ be obtained. In a thin detector formed from long wavelength material, there is a very large shift of peak spectral response toward shorter wavelengths. This result is summarized in FIG. 4. In other words, if the thickness $t_A$ of detector A is less than $1/\alpha$, part of the incident power is transmitted through detector A. The transmittance T or fraction of incident power transmitted through detector A is $$T = \frac{(1-r)^2 \exp(-\alpha t)}{1 - r^2 \exp(-2\alpha t)},$$

which is plotted in FIG. 5 for different detector thickness.

Figure 4:
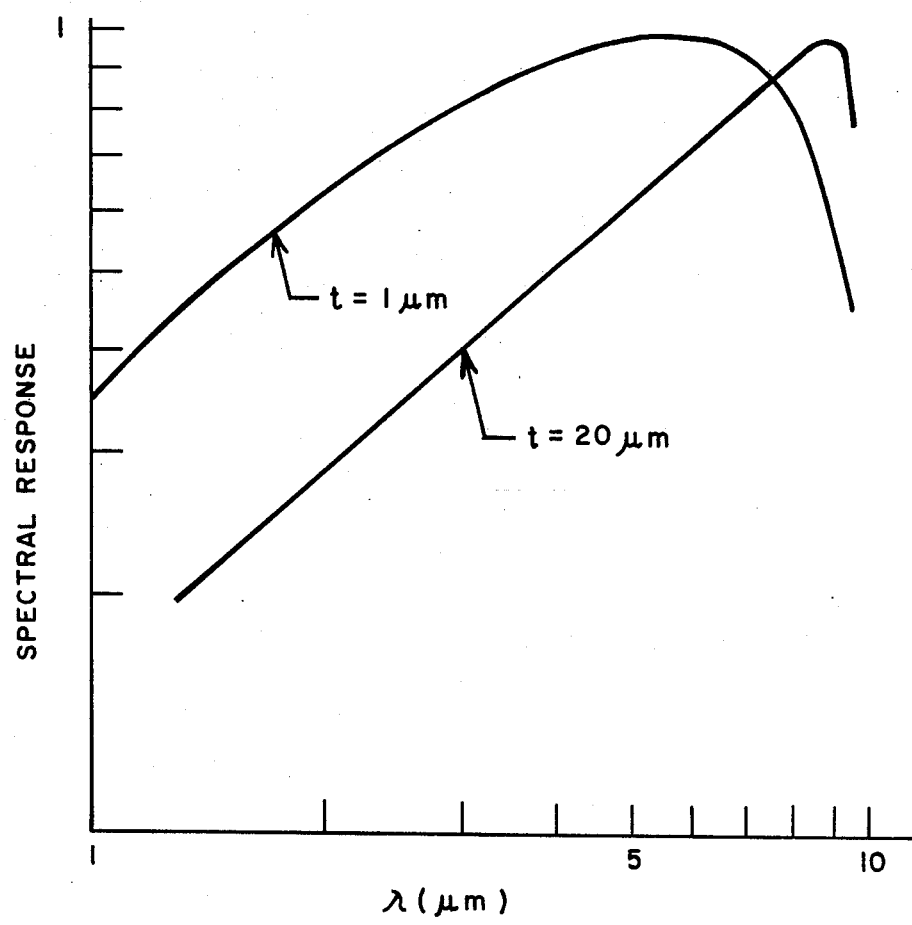
FIG. 4 shows spectral response as a function of wavelength for two mercury cadmium telluride photodetectors having different thicknesses.
Figure 6:
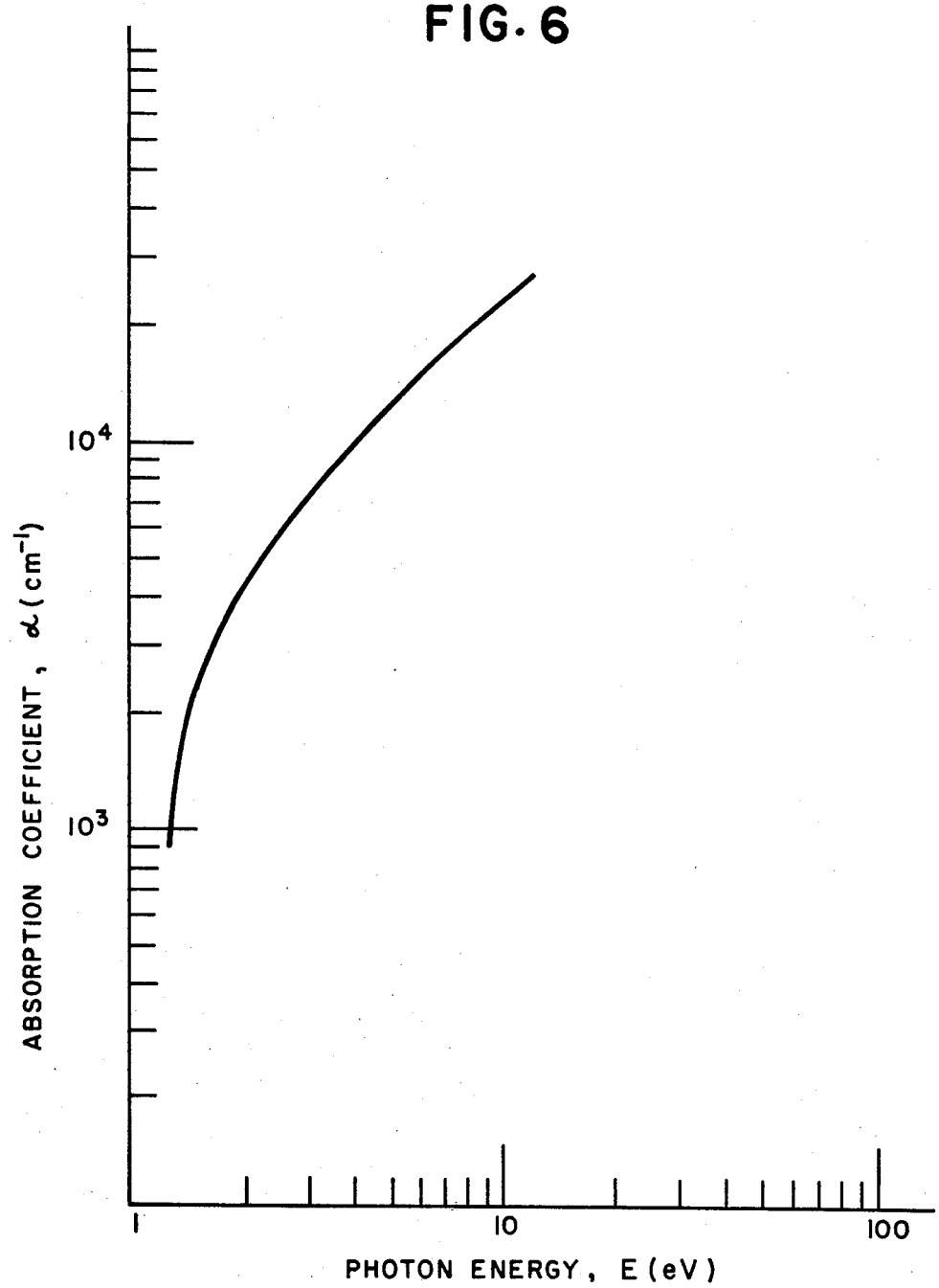
FIG. 6 shows the absorption coefficient of $Hg_{0.8}Cd_{0.2}Te$ at 175° K as a function of photon energy.

In FIGS. 3, 4, and 5, all the calculations are based on $x = 0.2$ (Hg,Cd)Te material operating at 175° K. The absorption coefficients used in these calculations are plotted in FIG. 6.

The system of FIG. 2 consists of two detectors, A and B, which are stacked in pyramid configuration on a substrate 20. The responsivities of detectors A and B are $$R_A = \frac{V_B \lambda \tau}{l w h c n} \cdot \frac{\eta_A}{t_A} \qquad \text{EQ. 3}$$

$$R_B = \frac{V_B \lambda \tau}{l w h c n} \cdot \frac{\eta_B}{t_B}, \qquad \text{EQ. 4}$$

provided that the two detectors are fabricated from the same material and operated under the same bias voltages. If P is the incident radiation power, the signals from detectors A and B are $$V_{SA} = \frac{V_B \lambda \tau}{l w h c n} \cdot P \frac{\eta A}{t_A} \qquad \text{EQ. 5}$$

$$V_{SB} = \frac{V_B \lambda \tau}{l w h c n} \cdot P T_A \frac{\eta B}{t_B} \qquad \text{EQ. 6}$$

where $T_A$ is the transmittance of detector A. The ratio R of the signals from detectors A and B, is $$R = \frac{V_{SA}}{V_{SB}} = \frac{\eta_A t_B}{T_A \eta_B t_A} \qquad \text{EQ. 7}$$

Figure 7:
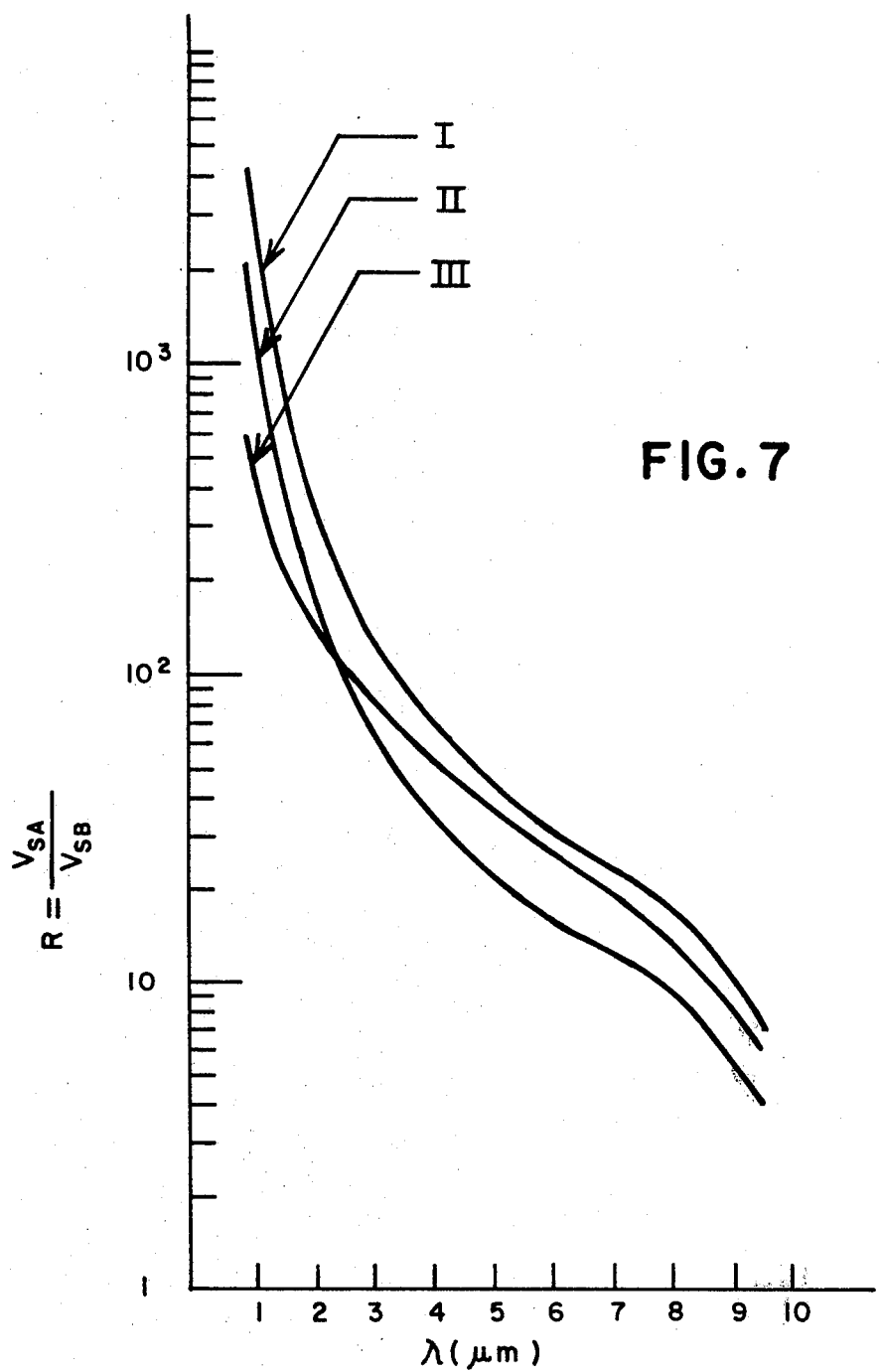
FIG. 7 shows the ratio output for three different photodetector systems of the present invention.

Equation 7 illustrates that once $t_A$ and $t_B$ are fixed, the ratio R has a unique value for any given incident wavelength. In FIG. 7, the ratio R is plotted for three devices. In device I, $t_A$ is 2 microns and $t_B$ is 20 microns. In device II, $t_A$ is 1 micron and $t_B$ is 20 microns. In device III, $t_A$ is 2 microns and $t_B$ is 10 microns.

As shown in FIG. 7, for a given two-detector device, the ratio R for the same incident wavelength is definite and independent of the intensity of the incident radiation. In other words, when an unknown line source is detected, the wavelength of the incident radiation can be resolved from the ratio R of the signals.

The photodetector system of the present invention can be used to resolve the wavelength of an unknown line source over a broad spectral range In addition, a broad wavelength source also can produce a discrete ratio from the photodetector system. The system, therefore, can be calibrated for blackbody or other broad band sources. For example, a 500° K blackbody results in a discrete ratio which is different from a 1000° K blackbody.

Although the present invention has been described with reference to a series of preferred embodiments, workers skilled in the art will recognize that changes in form or details may be made without departing from the spirit and scope of the invention. For example, although mercury cadmium telluride and silicon have been described as suitable materials for the present invention, other well known photodetector materials may also be used.

The embodiments of the invention in which an exclusive property or right is claimed are defined as follows:
1. A photodetector system comprising:
   first photodetector means for producing a first photosignal in response to incident electromagnetic radiation, the first photodetector means having a first band gap, a first thickness $t_A$, and an absorption coefficient $\alpha$ for radiation of energy equal to the first band gap, and wherein $t_A$ is less than $1/\alpha$;
   second photodetector means positioned to receive the incident electromagnetic radiation transmitted by the first photodetector means, the second photodetector means for producing a second photosignal in response to the incident electromagnetic radiation transmitted by the first photodetector means, the second photodetector means having a second band gap which is essentially equal to the first band gap and having a second thickness $t_B$ which is greater than the first thickness $t_A$; and signal processing means for receiving the first and second photosignals and producing an output signal.

2. The photodetector system of claim 1 wherein the signal processing means produces the output signal by taking the ratio of the first and second photosignals.

3. The photodetector system of claim 1 wherein the first and second photodetector means are mercury cadmium telluride photodetectors.

4. The system of claim wherein $t_A \leq 2$ microns.

5. The photodetector system of claim 4 wherein $t_B \leq 10$ microns.

6. The photodetector system of claim 1 wherein the first and second photodetector means are photoconductive detectors.

7. The photodetector system of claim 1 wherein the first and second photodetector means are photodiodes.

8. The photodetector system of claim 1 wherein the first and second photodetector means are silicon photodetectors.

9. A photodetector system comprising:

first photodetector means for producing a first photosignal in response to incident electromagnetic radiation, the first photodetector having a first band gap, and having a first thickness $t_A$ which is insufficient to absorb all incident electromagnetic radiation of energy equal to the first band gap; and second photodetector means for producing a second photosignal in response to electromagnetic radiation which is transmitted by the first photodetector means, the second photodetector means having a second band gap which is essentially equal to the first band gap, and having a second thickness $t_B$ which is greater than the first thickness $t_A$.

10. The photodetector system of claim 9 and further comprising:

signal processing means for receiving the first and second photosignals and producing an output signal indicative of the ratio of the first and second photosignals.

11. The photodetector of claim 9 wherein the first and second photodetectors are silicon photodetectors 12. The photodetectors of claim 9 wherein the first and second photodetectors means are mercury cadmium telluride photodetectors.

13. The photodetector of claim 12 wherein $t_A \leq 2$ microns.

14. The photodetector of claim 13 wherein $t_B \geq 10$ microns.

15. The photodetector of claim 9 wherein the first and second photodetector means are photoconductive detectors.

16. The photodetector of claim 9 wherein the first and second photodetector means are photodiodes.

* * * * *